US012666986B2

(12) United States Patent
Yen et al.

(10) Patent No.: US 12,666,986 B2
(45) Date of Patent: Jun. 23, 2026

(54) ELECTRONIC PACKAGE AND MANUFACTURING METHOD THEREOF

(71) Applicant: SILICONWARE PRECISION INDUSTRIES CO., LTD., Taichung City (TW)

(72) Inventors: Chung-Chih Yen, Taichung City (TW); Kuo-Hui Wan, Taichung City (TW); Chun-Chu Lai, Taichung City (TW)

(73) Assignee: SILICONWARE PRECISION INDUSTRIES CO., LTD., Taichung City (TW)

( * ) Notice: Subject to any disclaimer, the term of this patent is extended or adjusted under 35 U.S.C. 154(b) by 354 days.

(21) Appl. No.: 18/587,276

(22) Filed: Feb. 26, 2024

(65) Prior Publication Data

US 2025/0132241 A1     Apr. 24, 2025

(30) Foreign Application Priority Data

Oct. 24, 2023     (TW) ................................. 112140638

(51) Int. Cl.
| | |
|---|---|
| *H10W 70/65* | (2026.01) |
| *H10W 74/10* | (2026.01) |
| *H10W 90/00* | (2026.01) |
| *H10W 74/00* | (2026.01) |

(52) U.S. Cl.
CPC .......... *H10W 70/65* (2026.01); *H10W 74/117* (2026.01); *H10W 90/00* (2026.01); *H10W 74/00* (2026.01); *H10W 90/724* (2026.01)

(58) Field of Classification Search
CPC ... H10W 70/65; H10W 90/00; H10W 90/724; H10W 74/117; H10W 74/00
USPC ......................................................... 257/734
See application file for complete search history.

(56) References Cited

U.S. PATENT DOCUMENTS

| | | | | | |
|---|---|---|---|---|---|
| 10,325,891 | B1 * | 6/2019 | Lim | ...................... | H10W 90/00 |
| 10,797,021 | B2 * | 10/2020 | Kim | ...................... | H10W 42/20 |
| 11,462,498 | B2 * | 10/2022 | Park | ................... | H10W 70/614 |

* cited by examiner

*Primary Examiner* — Tu-Tu V Ho
(74) *Attorney, Agent, or Firm* — Studebaker Brackett PLLC

(57) ABSTRACT

An electronic package and a manufacturing method thereof are provided, in which a groove space for accommodating an electronic element is formed on a wiring structure, and an encapsulation layer is formed on the wiring structure to cover the electronic element. Via the design of the groove space, the overall thickness of the electronic package can be easily thinned to meet the demand for miniaturization.

13 Claims, 5 Drawing Sheets

1

11  12

14

13
15

10

19    112    17

ELECTRONIC PACKAGE AND MANUFACTURING METHOD THEREOF

BACKGROUND

1. Technical Field

The present disclosure relates to a semiconductor packaging technology, and more particularly, to a thinned electronic package and a manufacturing method thereof.

2. Description of Related Art

With the evolution of semiconductor packaging technology, different packaging types have been developed for semiconductor devices. In order to improve electrical functions and save packaging space, different three-dimensional packaging technologies have been developed to integrate integrated circuits with different functions into a single package structure. For example, electronic elements with different functions (such as: memory, central processing unit, graphics processor, imaging application processor, etc.) can achieve the integration of the system via stacking design for application in thin and light electronic products.

FIG. 1 is a schematic cross-sectional view of a conventional semiconductor package 1. The semiconductor package 1 includes: an encapsulation colloid 15, a semiconductor chip 11 embedded in the encapsulation colloid 15, a circuit structure 10 and a wiring structure 14 disposed on opposite sides of the encapsulation colloid 15, and a plurality of conductive pillars 13 embedded in the encapsulation colloid 15 for electrically connecting the circuit structure 10 and the wiring structure 14, wherein the semiconductor chip 11 is adhered to the wiring structure 14 via a die attach film 12 and is electrically connected to the circuit structure 10 via a plurality of conductors 112, and a plurality of solder balls 17 and a passive element 19 are formed on the lower side of the circuit structure 10, so that the semiconductor package 1 is connected to a circuit board (not shown) via the solder balls 17.

However, in the conventional semiconductor package 1, the die attach film 12 is formed between the semiconductor chip 11 and the wiring structure 14, so that it is difficult to thin the overall thickness of the semiconductor package 1. Therefore, it is not conducive to meeting the demand for miniaturization.

Therefore, how to overcome the above-mentioned problems of the prior art has become an urgent issue in the industry that needs to be overcome.

SUMMARY

In view of the various deficiencies of the prior art, the present disclosure provides an electronic package, which comprises: a wiring structure having a groove space; an encapsulation layer formed on the wiring structure, wherein the encapsulation layer has a first surface and a second surface opposing the first surface, and the second surface of the encapsulation layer is bonded to the wiring structure; an electronic element embedded in the encapsulation layer and located in the groove space; a plurality of conductive pillars embedded in the encapsulation layer and electrically connected to the wiring structure; and a circuit structure formed on the first surface of the encapsulation layer and electrically connected to the plurality of conductive pillars and the electronic element.

The present disclosure also provides a method of manufacturing an electronic package, the method comprises: forming a conductive layer on part of a surface of a carrier board, and disposing an electronic element on other parts of the surface of the carrier board; forming an encapsulation layer on the carrier board to cover the electronic element, wherein the encapsulation layer has a first surface and a second surface opposing the first surface, wherein the second surface of the encapsulation layer is bonded to the carrier board and the conductive layer, and the second surface of the encapsulation layer presents an uneven surface; removing the carrier board and the conductive layer to expose the second surface of the encapsulation layer and the electronic element; and forming a wiring structure on the second surface of the encapsulation layer and on the electronic element, wherein the wiring structure is formed with a groove space corresponding to the second surface, and the electronic element is located in the groove space.

In the aforementioned electronic package and method, the electronic element is in contact with the wiring structure.

In the aforementioned electronic package and method, the present disclosure further comprises forming a plurality of conductive elements on the wiring structure, wherein the conductive elements are electrically connected to the wiring structure.

In the aforementioned electronic package and method, the present disclosure further comprises forming a plurality of conductive pillars on the conductive layer, wherein the encapsulation layer covers the conductive pillars, and the conductive pillars are electrically connected to the wiring structure. For example, the plurality of conductive pillars are located outside the groove space. Alternatively, the present disclosure further comprises forming a circuit structure on the first surface of the encapsulation layer, wherein the circuit structure is electrically connected to the plurality of conductive pillars and the electronic element.

In the aforementioned electronic package and method, the present disclosure further comprises forming a circuit structure on the first surface of the encapsulation layer, wherein the circuit structure is electrically connected to the electronic element. Furthermore, the present disclosure further comprises forming a plurality of conductive elements on the circuit structure, wherein the conductive elements are electrically connected to the circuit structure.

As can be seen from the above, the electronic package and the manufacturing method thereof according to the present disclosure mainly rely on the design of the conductive layer, so that after the carrier board and the conductive layer are removed, the wiring structure can be formed with a groove space. Therefore, compared with the prior art, the electronic element is accommodated in the groove space of the electronic package of the present disclosure, so that the overall thickness of the electronic package can be easily thinned to meet the demand for miniaturization.

DETAILED DESCRIPTIONS

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "above," "on," "upper," "first," "second," "a," "one" and the like are merely for clear explanation rather than limiting the practicable scope of the present disclosure, and thus, alterations or adjustments of the relative relationships thereof without essentially altering the technical contents should still be considered in the practicable scope of the present disclosure.

FIG. 2A to FIG. 2F are schematic cross-sectional views illustrating a manufacturing method of an electronic package 2 according to the present disclosure.

Figure 1:
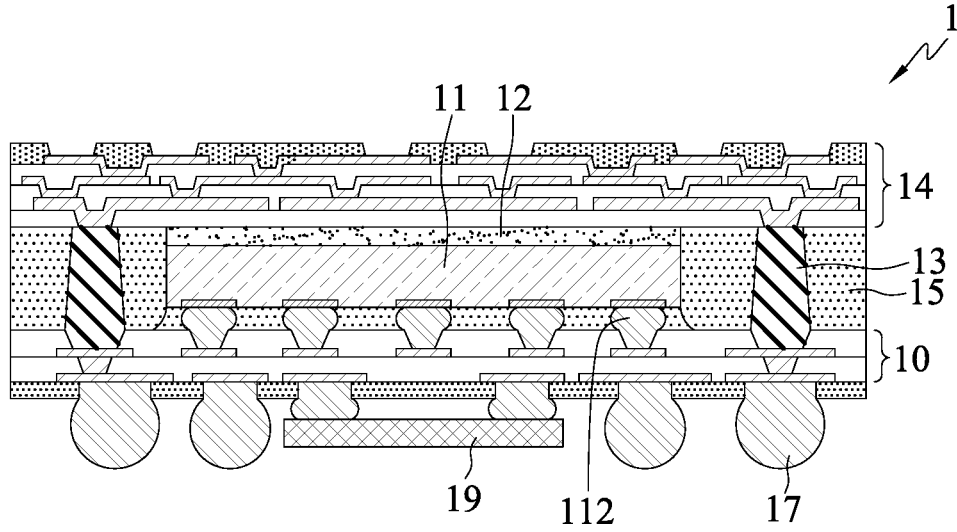
FIG. 1 is a schematic cross-sectional view of a conventional semiconductor package.
Figure 2A:
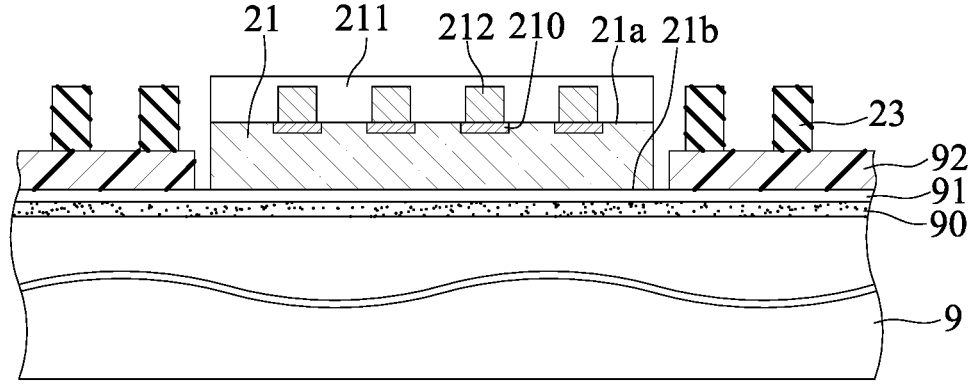
FIG. 2A to FIG. 2F are schematic cross-sectional views illustrating a manufacturing method of an electronic package according to the present disclosure.

As shown in FIG. 2A, a conductive layer 92 is formed on part of the surface of a carrier board 9, and a plurality of conductive pillars 23 are formed on the conductive layer 92, wherein at least one electronic element 21 is disposed on other parts of the surface of the carrier board 9 (surfaces without the conductive layer).

The carrier board 9 is, for example, a board made of semiconductor material (such as silicon or glass), and the conductive layer 92 is a metal layer.

In one embodiment, a release layer 90 and an adhesive layer 91 are sequentially formed on the carrier board 9 by, for example, coating, for the conductive layer 92 to be bonded onto the adhesive layer 91, wherein the conductive layer 92 is etched from a copper layer such as copper foil. For example, a copper foil is bonded onto the adhesive layer 91, and then the copper foil is patterned to expose part of the surface of the adhesive layer 91.

The conductive pillars 23 are formed on the conductive layer 92 by electroplating the conductive layer 92.

In one embodiment, the conductive pillars 23 are made of a metal material such as copper or a solder material.

The electronic element 21 is an active element, a passive element, or a combination of the active element and the passive element, wherein the active element is, for example, a semiconductor chip, and the passive element is, for example, a resistor, a capacitor, or an inductor.

In one embodiment, the electronic element 21 is a semiconductor chip and has an active surface 21a and an inactive surface 21b opposing the active surface 21a, wherein the electronic element 21 is bonded onto the adhesive layer 91 with the inactive surface 21b thereof, and the active surface 21a has a plurality of electrode pads 210 and a protective film 211 made of such as a passivation material, and wherein a plurality of conductors 212 are bonded on and electrically connected to the electrode pads 210, and the conductors 212 are embedded in the protective film 211. For example, each of the conductors 212 is a conductive line, a sphere-shaped conductive member of a solder ball, or a pillar-shaped conductive member of a metal material such as a copper pillar and a solder bump, or a stud-shaped conductive member made by a wire bonding machine, but the present disclosure is not limited to as such.

Figure 2B:
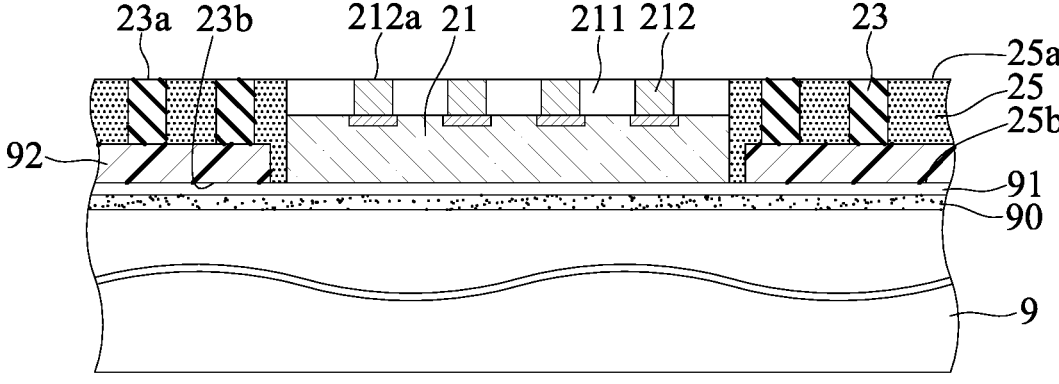

As shown in FIG. 2B, an encapsulation layer 25 is formed on the adhesive layer 91 and the conductive layer 92 of the carrier board 9, so that the encapsulation layer 25 covers the electronic element 21, the plurality of conductors 212 and the plurality of conductive pillars 23, wherein the encapsulation layer 25 has a first surface 25a and a second surface 25b opposing the first surface 25a, so that the protective film 211, end surfaces 212a of the conductors 212 and end surfaces 23a of the conductive pillars 23 are exposed from the first surface 25a of the encapsulation layer 25, and wherein the second surface 25b of the encapsulation layer 25 is bonded onto the adhesive layer 91 and the conductive layer 92 of the carrier board 9, so that the second surface 25b of the encapsulation layer 25 presents an uneven surface.

In one embodiment, the encapsulation layer 25 is made of an insulating material, such as polyimide (PI), dry film, encapsulation colloid such as epoxy resin, or molding compound. For example, the encapsulation layer 25 may be formed on the adhesive layer 91 and the conductive layer 92 by liquid compound, injection, lamination, or compression molding.

Furthermore, the first surface 25a of the encapsulation layer 25 can be flush with the protective film 211, the end surfaces 23a of the conductive pillars 23 and the end surfaces 212a of the conductors 212 via a leveling process, so that the end surfaces 23a of the conductive pillars 23 and the end surfaces 212a of the conductors 212 are exposed from the first surface 25a of the encapsulation layer 25. For example, the leveling process removes part of the material of the protective film 211, part of the material of the conductive pillars 23, part of the material of the conductors 212 and part of the material of the encapsulation layer 25 via grinding.

Figure 2C:
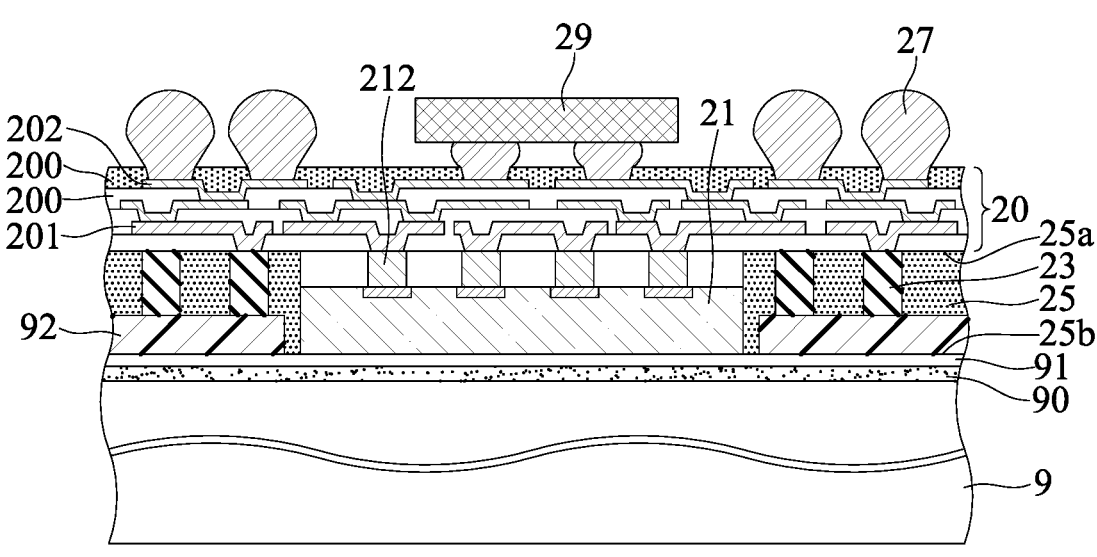

As shown in FIG. 2C, a circuit structure 20 is formed on the first surface 25a of the encapsulation layer 25, and the circuit structure 20 is electrically connected to the plurality of conductive pillars 23 and the plurality of conductors 212.

In one embodiment, the circuit structure 20 includes at least one insulating layer 200 and a circuit layer 201 formed on the insulating layer 200, wherein the outermost insulating layer 200 can be used as a solder mask layer, and the outermost circuit layer 201 is exposed from the solder mask layer to serve as electrical contact pads 202 so as to form a plurality of conductive elements 27 such as solder bumps, copper bumps, or others on the electrical contact pads 202, and the conductive elements 27 are electrically connected to the electrical contact pads 202. For example, the circuit structure 20 is manufactured according to redistribution layer (RDL) specifications.

Furthermore, an under-bump metallurgy (UBM) layer (not shown) can be formed on the electrical contact pads 202 to facilitate bonding with the conductive elements 27.

Furthermore, the material for forming the circuit layer 201 is copper, and the material for forming the insulating layer 200 is a dielectric material such as polybenzoxazole (PBO), polyimide (PI), prepreg (PP), or a solder resist material such as solder mask, ink and the like.

In addition, at least one auxiliary functional element 29, such as a passive element, can be disposed on some of the electrical contact pads 202 of the circuit structure 20 as needed.

Figure 2D:
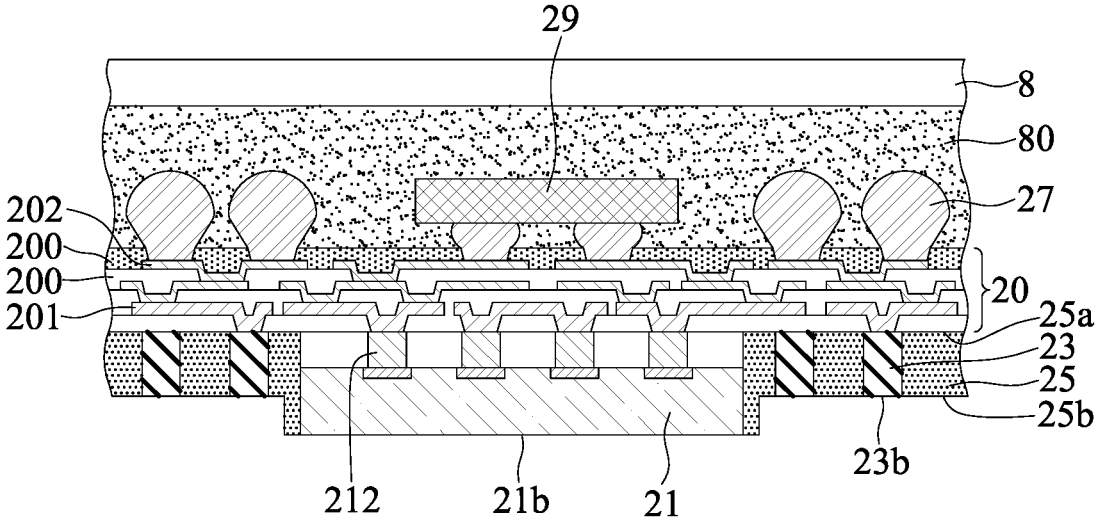

As shown in FIG. 2D, the conductive elements 27 are connected to a support board 8, and then the carrier board 9 and the conductive layer 92 thereon are removed to expose the second surface 25b of the encapsulation layer 25, the other end surfaces 23b of the conductive pillars 23 and the inactive surface 21b of the electronic element 21.

In one embodiment, an adhesive layer 80 is formed on the support board 8, and the circuit structure 20 is bonded to the adhesive layer 80, wherein the conductive elements 27 and the auxiliary functional element 29 are embedded in the adhesive layer 80, and after removing the carrier board 9 and the release layer 90 and the adhesive layer 91 thereon, the conductive layer 92 is then removed by etching. At this time, the other end surfaces 23b of the conductive pillars 23 are flush with the second surface 25b of the encapsulation layer 25 and exposed from the second surface 25b of the encapsulation layer 25.

Figure 2E:
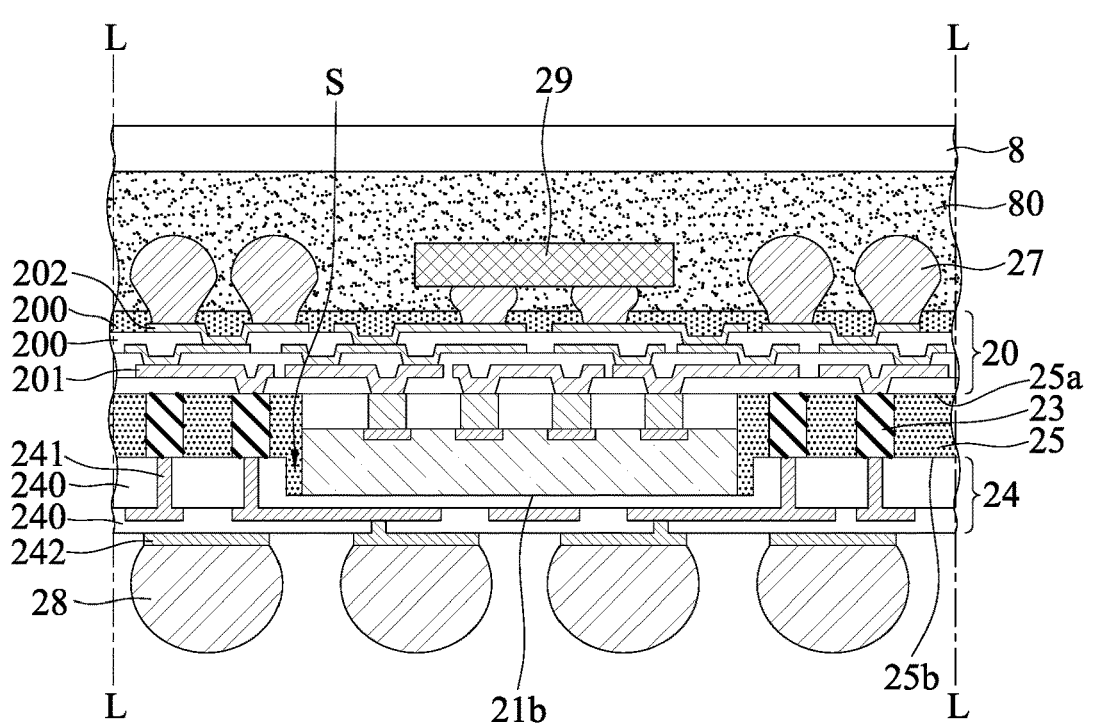

As shown in FIG. 2E, a wiring structure 24 electrically connected to the plurality of conductive pillars 23 is formed on the second surface 25b of the encapsulation layer 25 and the inactive surface 21b of the electronic element 21, wherein the wiring structure 24 is formed with a groove space S corresponding to the position of the electronic element 21.

In one embodiment, the wiring structure 24 includes a plurality of dielectric layers 240 and a wiring layer 241 bonded to the dielectric layers 240. For example, the dielectric layer 240 is in contact with the inactive surface 21b of the electronic element 21, and the wiring layer 241 is disposed with a plurality of electrical connection pads 242 on the outermost dielectric layer 240 to bond to conductive elements 28 such as solder bumps, copper bumps, or others.

Furthermore, the material for forming the dielectric layer 240 is a dielectric material such as polybenzoxazole (PBO), polyimide (PI), prepreg (PP), or other materials, and the wiring layer 241 and the dielectric layer 240 can be formed using a redistribution layer (RDL) process.

In addition, the electronic element 21 is located in the groove space S, and the conductive pillars 23 are located outside the groove space S.

Figure 2F:
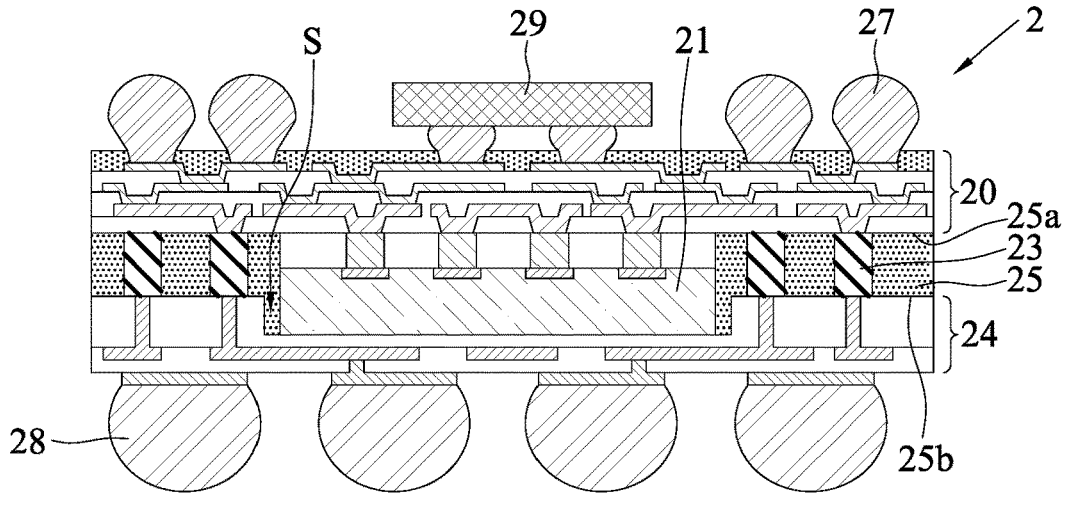

As shown in FIG. 2F, the support board 8 is removed, and then a singulation process is performed along a cutting path L as shown in FIG. 2E to obtain a plurality of the electronic packages 2. Moreover, the electronic package 2 can be externally connected to another electronic module or other electronic components (not shown) via the conductive elements 27, 28.

Figure 3:
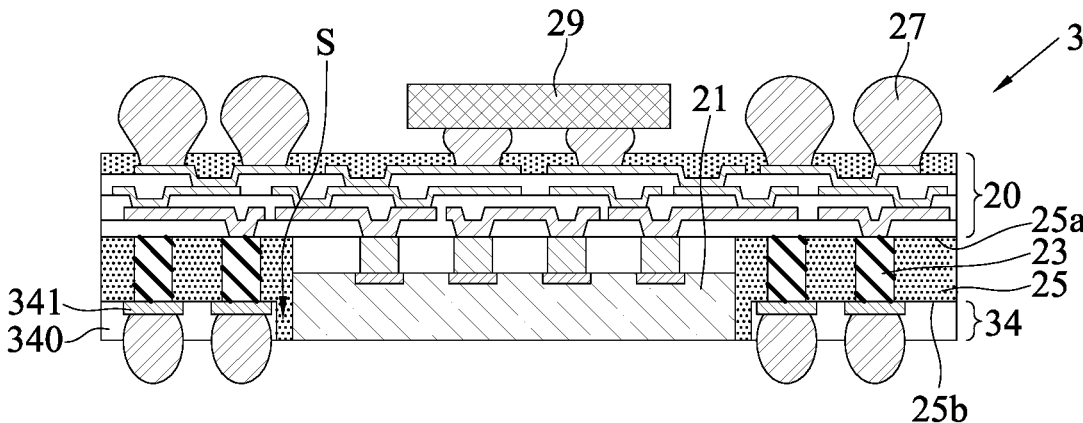
FIG. 3 is a schematic cross-sectional view of another embodiment of FIG. 2F.

Please refer to FIG. 3. In other embodiments, a wiring structure 34 only has a single wiring layer 341, which is formed on the second surface 25b of the encapsulation layer 25 and is electrically connected to the plurality of conductive pillars 23, and a dielectric layer 340 covers the wiring layer 341 and the inactive surface 21b of the electronic element 21. For example, the dielectric layer 340 is used as a solder mask layer and has a plurality of openings, and parts of the surface of the wiring layer 341 are exposed from the openings for bonding with the conductive elements 28.

Therefore, in the manufacturing method of the present disclosure, the conductive layer 92 is mainly designed to expose the adhesive layer 91, so that after the carrier board 9 and the conductive layer 92 are removed, the wiring structure 24, 34 may be formed with the groove space S, so that the electronic element 21 is accommodated in the groove space S. Therefore, compared with the prior art, there is no conventional die attach film between the electronic element 21 and the wiring structure 24, 34 of the electronic package 2, 3 of the present disclosure, so that the overall thickness of the electronic package 2, 3 is thinned to meet the demand for miniaturization.

The present disclosure provides an electronic package 2, 3, which comprises: a wiring structure 24, 34, an encapsulation layer 25 and at least one electronic element 21.

The wiring structure 24, 34 has a groove space S.

The encapsulation layer 25 is formed on the wiring structure 24, 34, wherein the encapsulation layer 25 has a first surface 25a and a second surface 25b opposing the first surface 25a, and the second surface 25b of the encapsulation layer 25 is bonded to the wiring structure 24, 34.

The electronic element 21 is embedded in the encapsulation layer 25 and located in the groove space S.

In one embodiment, the electronic element 21 is in contact with the wiring structure 24, 34.

In one embodiment, the electronic package 2, 3 includes a plurality of conductive elements 28 disposed on the wiring structure 24, 34 and electrically connected to the wiring structure 24, 34.

In one embodiment, the electronic package 2, 3 further includes a plurality of conductive pillars 23 embedded in the encapsulation layer 25 and electrically connected to the wiring structure 24, 34. For example, the conductive pillars 23 are located outside the groove space S. Alternatively, the electronic package 2, 3 further includes a circuit structure 20 formed on the first surface 25a of the encapsulation layer 25, and the circuit structure 20 is electrically connected to the conductive pillars 23 and the electronic element 21.

In one embodiment, the electronic package 2, 3 further includes a circuit structure 20 formed on the first surface 25a of the encapsulation layer 25, and the circuit structure 20 is electrically connected to the electronic element 21. The electronic package 2, 3 further includes a plurality of conductive elements 27 disposed on the circuit structure 20 and electrically connected to the circuit structure 20.

To sum up, in the electronic package and the manufacturing method thereof according to the present disclosure, the wiring structure is designed to form a groove space to accommodate the electronic element in the groove space, so that the conventional die attach film does not need to be formed between the electronic element and the wiring structure of the electronic package of the present disclosure. Therefore, the present disclosure not only eliminates the need for a die attach film (DAF) and reduces the chance of occurring peeling and void problems, but also makes it easier to thin the overall thickness of the electronic package to meet the demand for miniaturization.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. An electronic package, comprising:
   a wiring structure having a groove space;
   an encapsulation layer formed on the wiring structure, wherein the encapsulation layer has a first surface and a second surface opposing the first surface, and the second surface of the encapsulation layer is bonded to the wiring structure;
   an electronic element embedded in the encapsulation layer and located in the groove space;
   a plurality of conductive pillars embedded in the encapsulation layer and electrically connected to the wiring structure; and
   a circuit structure formed on the first surface of the encapsulation layer and electrically connected to the plurality of conductive pillars and the electronic element.

2. The electronic package of claim 1, wherein the electronic element is in contact with the wiring structure.

3. The electronic package of claim 1, further comprising a plurality of conductive elements disposed on and electrically connected to the wiring structure.

4. The electronic package of claim 1, wherein the conductive pillars are located outside the groove space.

5. The electronic package of claim 1, further comprising a plurality of conductive elements disposed on and electrically connected to the circuit structure.

6. A method of manufacturing an electronic package, comprising:

forming a conductive layer on part of a surface of a carrier board, and disposing an electronic element on other parts of the surface of the carrier board;

forming an encapsulation layer on the carrier board to cover the electronic element, wherein the encapsulation layer has a first surface and a second surface opposing the first surface, wherein the second surface of the encapsulation layer is bonded to the carrier board and the conductive layer, and the second surface of the encapsulation layer presents an uneven surface;

removing the carrier board and the conductive layer to expose the second surface of the encapsulation layer and the electronic element; and forming a wiring structure on the second surface of the encapsulation layer and on the electronic element, wherein the wiring structure is formed with a groove space corresponding to the second surface, and the electronic element is located in the groove space.

7. The method of claim 6, wherein the electronic element is in contact with the wiring structure.

8. The method of claim 6, further comprising forming a plurality of conductive elements on the wiring structure, wherein the conductive elements are electrically connected to the wiring structure.

9. The method of claim 6, further comprising forming a plurality of conductive pillars on the conductive layer, wherein the encapsulation layer covers the conductive pillars, and the conductive pillars are electrically connected to the wiring structure.

10. The method of claim 9, wherein the plurality of conductive pillars are located outside the groove space.

11. The method of claim 9, further comprising forming a circuit structure on the first surface of the encapsulation layer, wherein the circuit structure is electrically connected to the plurality of conductive pillars and the electronic element.

12. The method of claim 6, further comprising forming a circuit structure on the first surface of the encapsulation layer, wherein the circuit structure is electrically connected to the electronic element.

13. The method of claim 12, further comprising forming a plurality of conductive elements on the circuit structure, wherein the conductive elements are electrically connected to the circuit structure.

* * * * *